(12) United States Patent
Huang et al.

(10) Patent No.: US 12,392,807 B2
(45) Date of Patent: Aug. 19, 2025

(54) DETECTION DEVICE

(71) Applicant: SHENZHEN EVERBEST MACHINERY INDUSTRY CO., LTD., Guangdong (CN)

(72) Inventors: Zhijian Huang, Guangdong (CN); Zhaojie Hu, Guangdong (CN)

(73) Assignee: SHENZHEN EVERBEST MACHINERY INDUSTRY CO., LTD., Shenzhen (CN)

( * ) Notice: Subject to any disclaimer, the term of this patent is extended or adjusted under 35 U.S.C. 154(b) by 191 days.

(21) Appl. No.: 18/203,663

(22) Filed: May 31, 2023

(65) Prior Publication Data
US 2024/0255552 A1    Aug. 1, 2024

(30) Foreign Application Priority Data
Jan. 31, 2023    (CN) .......................... 202320223009.3

(51) Int. Cl.
   *G01R 19/25*      (2006.01)
   *G01V 11/00*      (2006.01)

(52) U.S. Cl.
   CPC ........ *G01R 19/2503* (2013.01); *G01V 11/002* (2013.01)

(58) Field of Classification Search
None
See application file for complete search history.

(56) References Cited

U.S. PATENT DOCUMENTS

| | | | |
|---|---|---|---|
| 2006/0145714 A1* | 7/2006 | Cruz .................... | G01R 15/125 324/754.03 |
| 2014/0267753 A1* | 9/2014 | Epperson ................ | G01D 5/39 348/160 |
| 2022/0404424 A1* | 12/2022 | Watts ................. | G01R 31/3842 |

* cited by examiner

*Primary Examiner* — Jas A Sanghera
(74) *Attorney, Agent, or Firm* — Fideli Law PLLC; Qiang Li (57) ABSTRACT

A detection device includes a housing, a wall detection assembly and a multimeter assembly, wherein the wall detection assembly comprises a sensing assembly and a wall detection processing circuit, the sensing assembly comprising at least one of a metal detection sensing element, a foreign object detection sensing element and an alternating-current voltage signal sensing element; wherein the sensing assembly and the wall detection processing circuit are arranged spaced apart in a first direction the sensing assembly and the multimeter assembly are arranged staggered in a second direction; and the sensing assembly is mounted to an inner side wall of the housing via a connection structure which is a non-metallic material structure. The staggered arrangement of the sensing assembly and the multimeter assembly adopts a staggering with a spatial distance, thereby reducing the adverse effects of large-volume metallic components and parts of a multimeter on the sensing assembly.

18 Claims, 8 Drawing Sheets

DETECTION DEVICE

CROSS REFERENCE TO RELATED APPLICATIONS

The present application claims the benefit of Chinese Patent Application No. 202320223009.3 filed on Jan. 31, 2023, the contents of which are incorporated herein by reference in their entirety.

TECHNICAL FIELD

The present application relates to the technical field of electronic detection tools, and more specifically to a detection device.

BACKGROUND ART

In the decoration project of a building, the use of a wall detector and a digital multimeter is involved. The wall detector is configured to detect the specific locations of metal structures, wooden structures and laid circuits on the back of a wall, such as the locations of metal pipes, steel bars, wooden beams, and lighting circuits. The digital multimeter is configured to detect whether various electrical parameters including voltage, current, and resistance of each laid circuit are normal, and to detect whether the connection of each laid circuit is correct, so as to ensure the safe use of electricity inside and outside the building.

A wall detection part involves the use of a sensing element, for example, a non-contact sensing element is configured to obtain the specific locations of the metal pipes, the steel bars, the wooden beams or the lighting circuits on the back of the wall. A multimeter detection part is provided with multiple types of large-volume metallic components and parts, such as an input post, a fuse, a knob dial, and a battery structure. Moreover, metallic fasteners such as threaded connections are also used between different components in the detection device to fix the mutual positional relationship.

However, in a detection operation, it is necessary to ensure that the wall detection part and the multimeter detection part do not interfere with each other, so as to avoid problems of false detection or reduced detection accuracy. Since the large-volume metallic components and parts in the multimeter detection part and the threaded connections for fixing the mutual positional relationship between different components will interfere with the detection accuracy of the sensing element, there is an urgent need to provide a sensing element arrangement method that can avoid the interference from the large-volume metallic components and parts of the multimeter detection part and the threaded connections, so as to achieve the purpose of enabling the wall detection part to provide accurate detection.

SUMMARY OF THE INVENTION

An objective of the embodiments of the present application is to provide a detection device in which a sensing element arrangement method that can avoid the interference from large-volume metallic components and parts of a multimeter detection part and threaded connections enables a wall detection part to provide accurate detection.

To achieve the foregoing objective, a technical solution adopted in the present application is to
provide a detection device, comprising a housing, a wall detection assembly and a multimeter assembly, wherein the wall detection assembly comprises a sensing assembly and a wall detection processing circuit, the sensing assembly and the wall detection processing circuit being both arranged inside the housing; and the sensing assembly being electrically connected to the wall detection processing circuit, and the sensing assembly comprising at least one of a metal detection sensing element, a foreign object detection sensing element and an alternating-current voltage signal sensing element;

wherein the sensing assembly and the wall detection processing circuit are arranged spaced apart in a first direction, and the sensing assembly and the multimeter assembly are arranged staggered in a second direction, the first direction and the second direction forming an included angle; and the sensing assembly is mounted to an inner side wall of the housing via a connection structure.

In an embodiment, the housing comprises a top housing and a bottom housing that are snap-fitted with respect to each other in the first direction, and the multimeter assembly further comprises a multimeter measurement circuit arranged inside the housing; and the wall detection processing circuit and the multimeter measurement circuit are arranged on the same plane which is arranged close to the top housing, and the sensing assembly is mounted to an inner side wall of the bottom housing via the connection structure.

In an embodiment, the sensing assembly comprises the metal detection sensing element, and the metal detection sensing element is detachably snapped to the inner side wall of the bottom housing via the connection structure.

In an embodiment, the inner side wall of the bottom housing is provided with a receiving structure adapted to the metal detection sensing element, the receiving structure having a receiving space for receiving the metal detection sensing element and access openings for allowing the metal detection sensing element to access the receiving space; and the metal detection sensing element is snapped in the connection structure, the connection structure is snapped on the access openings of the receiving structure, and the metal detection sensing element is snap-pressed into the receiving space by the connection structure.

In an embodiment, the connection structure comprises a connection board and a pair of snap rings, the pair of snap rings are arranged opposite and spaced apart from each other, the pair of snap rings are detachably snapped to the connection board, and two axial ends of the metal detection sensing element are respectively snapped in the pair of snap rings; and at least one pair of snap fittings are provided on an outer side of the access openings, the pair of snap fittings are arranged opposite and spaced apart from each other, and two opposite ends of the connection board are respectively detachably snapped to the pair of snap fittings.

In an embodiment, a board surface of the connection board is provided with a pair of snap openings through its thickness, the pair of snap openings are arranged spaced apart from each other, the pair of snap rings each have a snap head connected to a ring body thereof, and the two snap heads are respectively detachably snapped into the pair of snap openings, such that the metal detection sensing element is fixed relative to the connection board.

In an embodiment, the receiving structure comprises a pair of U-shaped structures arranged opposite and spaced apart from each other, openings of the pair of U-shaped structures are the access openings, and edges of the pair of U-shaped structures on the same side are provided with the pair of snap fittings; and a pair of snap steps are provided at the two opposite ends of the connection board, and the pair of snap steps are recessed from side edges of the connection board toward its inner side to form a stepped shape, and the pair of snap fittings are fastened to the pair of snap steps, such that the metal detection sensing element is fixed relative to the bottom housing.

In an embodiment, the sensing assembly comprises the metal detection sensing element, and the metal detection sensing element is bonded to the inner side wall of the bottom housing via the connection structure.

In an embodiment, the inner side wall of the bottom housing is provided with a receiving structure adapted to the metal detection sensing element, the receiving structure having a receiving space for receiving the metal detection sensing element and access openings for allowing the metal detection sensing element to access the receiving space; and the metal detection sensing element is snapped in the connection structure, the connection structure is bonded to the access openings of the receiving structure, and the metal detection sensing element is snap-pressed into the receiving space by the connection structure.

In an embodiment, the connection structure comprises a connection board and a pair of bonding rings, the pair of bonding rings are arranged opposite and spaced apart from each other, ring bodies of the pair of bonding rings are bonded to the connection board, two axial ends of the metal detection sensing element are respectively snapped in the pair of bonding rings, and two opposite ends of the connection board are bonded to edges of the access openings.

In an embodiment, the connection board is a circuit board electrically connected to the metal detection sensing element and the wall detection processing circuit.

In an embodiment, the sensing assembly comprises the foreign object detection sensing element and the alternating-current signal sensing element, the foreign object detection sensing element and the alternating-current signal sensing element being arranged in an integrated manner and forming an integrated structure which is bonded to the inner side wall of the bottom housing via the connection structure;

wherein the connection structure is a bonding layer structure.

the sensing assembly comprises the metal detection sensing element, the foreign object detection sensing element and the alternating-current signal sensing element, and the connection structure comprises a first connection structure and a second connection structure;

wherein the metal detection sensing element is detachably snapped to the inner side wall of the bottom housing via the first connection structure; the foreign object detection sensing element and the alternating-current signal sensing element are arranged in an integrated manner and form an integrated structure which is bonded to the inner side wall of the bottom housing via the second connection structure; wherein the second connection structure is a bonding layer;

the bottom housing is provided with a receiving groove for receiving the sensing assembly, and flat surfaces are provided on inner and outer sides of a groove bottom surface of the receiving groove;

wherein the flat surface on the inner side of the groove bottom surface comprises a first flat area and a second flat area, the metal detection sensing element is opposite and spaced from the first flat area, the integrated structure is bonded to the second flat area, and the second flat area avoids a spaced space between the metal detection sensing element and the first flat area.

In an embodiment, the top housing and the bottom housing are snap-fitted with each other and form a snap contour, and snap-fit positions of the top housing and the bottom housing are connected via a metallic fastener; and in a direction from an inner side to an outer side of the housing, the inner side wall where the snap contour is located is spaced from a groove wall of the receiving groove, and the sensing assembly is arranged on an inner side of the groove wall of the receiving groove, such that the sensing assembly is spaced apart from the metallic fastener.

The detection device provided in the embodiments of the present application has the following beneficial effects.

Compared with the prior art, in the detection device provided by the present application, the sensing assembly and the wall detection processing circuit are arranged spaced apart in a first direction, and the sensing assembly and the multimeter assembly are arranged staggered in a second direction, the first direction and the second direction being perpendicular to each other. The wall detection part and the multimeter part of the detection device are partitioned, and the sensing assembly and the multimeter assembly of the wall detection part are arranged staggered in the second direction. The multimeter detection part is provided with multiple types of large-volume metallic components and parts, such as an input post, a fuse, a knob dial, and a battery structure, and due to the staggered arrangement with a certain spatial distance, the adverse effects of large-volume metallic components and parts of the multimeter detection part on the sensing detection of the sensing assembly can be reduced.

The sensing assembly is mounted to the inner side wall of the housing via the connection structure, for example, it is fixed to the inner side wall of the bottom housing by means of a board, a snap structure or an adhesive layer structure, instead of metallic fasteners such as screws; in addition, the staggered arrangement with a certain spatial distance is adopted, so that the influence of metallic components or elements on the sensing assembly can be avoided, thereby improving the detection sensitivity and stability of the sensing assembly, so as to achieve the purpose of providing accurate detection by the wall detection part.

BRIEF DESCRIPTION OF THE DRAWINGS

In order to more clearly describe the technical solutions in the embodiments of the present application, the drawings required for describing the embodiments or the prior art will be briefly described below. Apparently, the drawings in the following description merely show some of the embodiments of the present application, and those of ordinary skill in the art would have obtained other drawings according to these drawings without involving any inventive effort.

Reference numerals in the drawings are as follows:

10. Housing; 20. Wall detection assembly; 30. Multimeter assembly; 40. Circuit arrangement layer; 50. Key assembly; 60. Connection structure;

101. Top housing; 102. Bottom housing; 102a. Flat surface; 102b. First flat area; 102c. Second flat area; 102d. Receiving structure; 102e. Access opening; 102f. Snap fitting;

201. Wall detection processing circuit; 202. Sensing assembly; 204. First display apparatus; 201a. Wall detection control unit; 201b. Metal detection processing circuit; 201c. Foreign object detection processing circuit; 201d. Alternating-current voltage signal processing circuit; 202a. Metal detection sensing element; 202b. Foreign object detection sensing element; 202c. Alternating-current voltage signal sensing element;

301. Multimeter measurement circuit; 302. Second display apparatus; 303. Battery structure; 304. Knob; 305. Input post hole group;

401. First arrangement surface; 402. Second arrangement surface; 401a. First arrangement area; 401b. Second arrangement area; 402a. First display control area; 402b. Second display control area; 402c. Key control area; 402d. Knob control area; 402e. Test lead contact control area;

601. Connection board; 602. Snap ring; 601a. Snap opening; 601b. Snap step; 602a. Snap head.

DETAILED DESCRIPTION OF EMBODIMENTS

In order to make the technical problems to be solved, the technical solutions, and the beneficial effects of the present application clearer, the present application will be described in further detail below with reference to the drawings and embodiments. It should be understood that the specific embodiments described herein are merely used to explain the present application and are not intended to limit the present application.

It should be noted that when an element is referred to as being "fixed to" or "arranged at" a further element, it can be directly located on the further element or indirectly located on the further element. When an element is referred to as being "connected to" a further element, it can be directly connected to the further element or indirectly connected to the further element.

It should be understood that the orientations or positional relationships indicated by the terms "length", "width", "upper", "lower", "front", "rear", "left", "right", "vertical", "horizontal", "top", "bottom", "inner", "outer", etc. are based on the orientations or positional relationships shown in the drawings, and are only for the convenience of describing the present application and simplifying the description, rather than indicating or implying that device or element referred to must have a specific orientation or be constructed and operated in a specific orientation, and therefore cannot be construed as limiting the present application.

In addition, the terms "first" and "second" are used for descriptive purposes only, and cannot be construed as indicating or implying relative importance or implicitly indicating the number of technical features indicated. Thus, the features defined with "first" and "second" can explicitly or implicitly include one or more of the features. In the description of the present application, the meaning of "a plurality of" is two or more, unless otherwise explicitly and specifically defined.

A detection device provided in the embodiments of the present application is now described.

Referring to FIGS. 1 to 10, the detection device provided in the embodiments of the present application comprises a housing 10, a wall detection assembly 20 and a multimeter assembly 30.

The wall detection assembly 20 comprises a sensing assembly 202 and a wall detection processing circuit 201. The sensing assembly 202 and the wall detection processing circuit 201 are both arranged inside the housing 10. The sensing assembly 202 is electrically connected to the wall detection processing circuit 201, and the sensing assembly 202 comprises at least one of a metal detection sensing element 202a, a foreign object detection sensing element 202b and an alternating-current voltage signal sensing element 202c. In an embodiment of the present application, preferably, the sensing assembly 202 comprises the metal detection sensing element 202a, the foreign object detection sensing element 202b and the alternating-current voltage signal sensing element 202c.

The sensor assembly 202 and the wall detection processing circuit 201 are arranged spaced apart in a first direction, and the sensor assembly 202 and the multimeter assembly 30 are arranged staggered in a second direction. The first direction and the second direction are perpendicular to each other. Moreover, the sensing assembly 202 is mounted to an inner side wall of the housing 10 via a connection structure 60. The connection structure 60 is a non-metallic material structure.

Compared with the prior art, in the detection device provided in the embodiment of the present application, the sensing assembly 202 and the wall detection processing circuit 201 are arranged spaced apart in the first direction, and the sensing assembly 202 and the multimeter assembly 30 are arranged staggered in the second direction, the first direction and the second direction forming an included angle, preferably the two being perpendicular to each other. A wall detection part and a multimeter part of the detection device are partitioned, and the sensing assembly 202 of the wall detection part and the multimeter assembly 30 are arranged staggered in the second direction. The multimeter detection part is provided with multiple types of large-volume metallic components and parts, such as an input post, a fuse, a knob 304 dial, and a battery structure 303, and due to the staggered arrangement with a certain spatial distance, the adverse effects of large-volume metallic components and parts of the multimeter detection part on the sensing detection of the sensing assembly 202 can be reduced.

The sensing assembly 202 is mounted to the inner side wall of the housing 10 via the connection structure 60. The connection structure 60 is a non-metallic material structure, and adopts a staggered arrangement with a certain spatial distance. In addition, the sensing assembly 202 is mounted to the inner side wall of the bottom housing 102 by means of a non-metallic connection structure 60, for example, it is fixed to the inner side wall of the bottom housing 102 by means of a non-metallic board, snap member or adhesive, so that the influence of metallic components or elements on the sensing assembly 202 can be avoided, thereby improving the detection sensitivity and stability of the sensing assembly 202, so as to achieve the purpose of providing accurate detection by the wall detection part.

Figure 1:
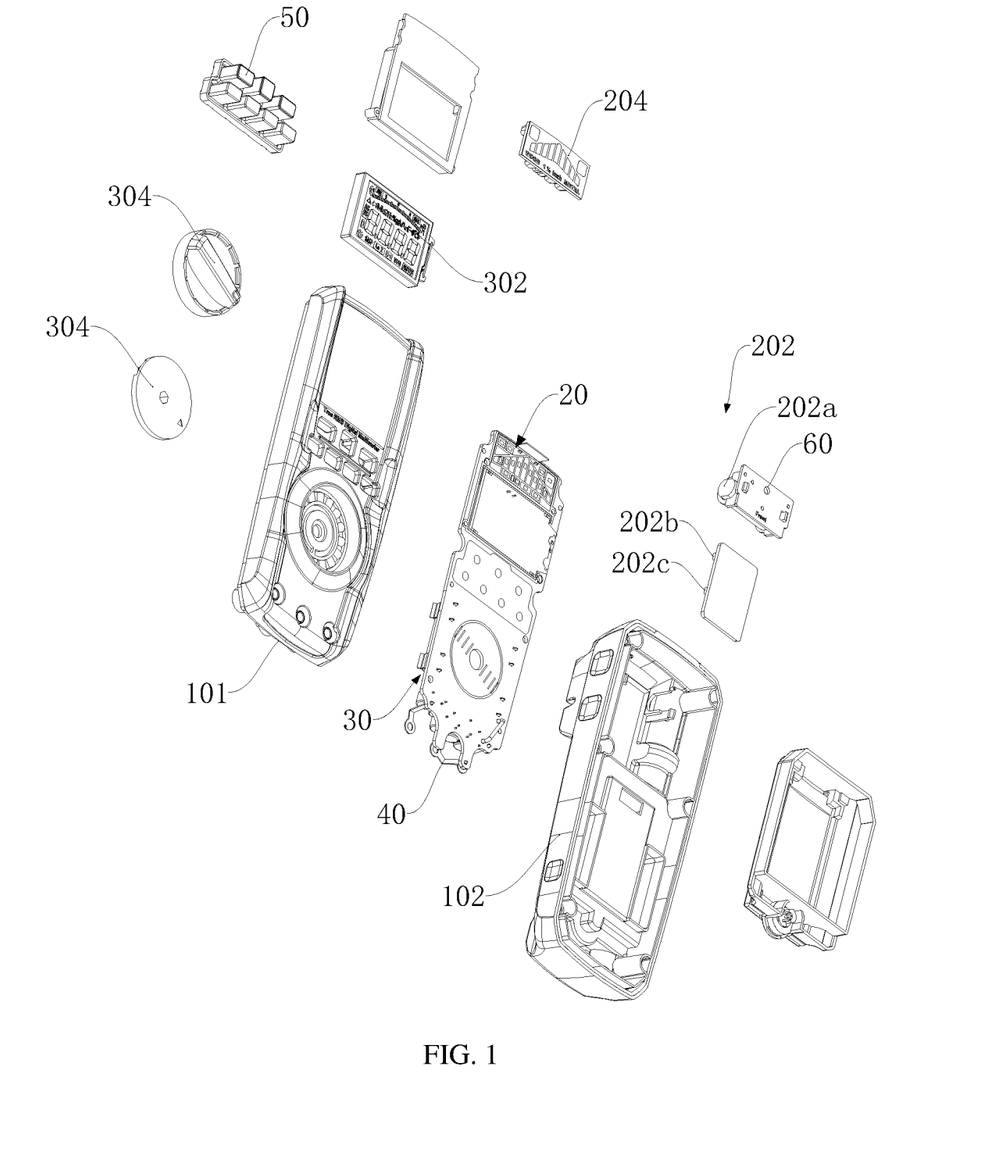
FIG. 1 is an exploded view of a detection device provided in an embodiment of the present application.

Referring to FIGS. 1 to 6, in an embodiment, the detection device further comprises a circuit arrangement layer 40. The circuit arrangement layer 40 is configured to arrange a circuit structure involved in the detection device. The circuit structure is arranged inside the housing 10. The housing 10 comprises a top housing 101 and a bottom housing 102 that are snap-fitted with respect to each other in the first direction, that is, in the thickness direction of the detection device as shown in FIG. 1. The wall detection assembly 20 further comprises a first display apparatus 204 and keys. The multimeter assembly 30 comprises a multimeter measurement circuit 301, a fuse, a battery structure 303 that are arranged inside the housing 10, and a knob 304 dial, an input post hole group 305, keys and a second display apparatus 302 that are arranged on the housing 10. The keys in the wall detection assembly 20 and the keys in the multimeter assembly 30 are combined into a key assembly 50.

Figure 2:
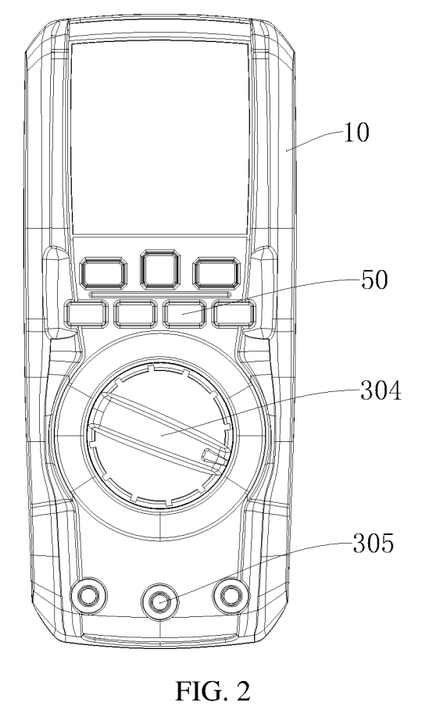
FIG. 2 is a front side view of a detection device provided in an embodiment of the present application.
Figure 3:
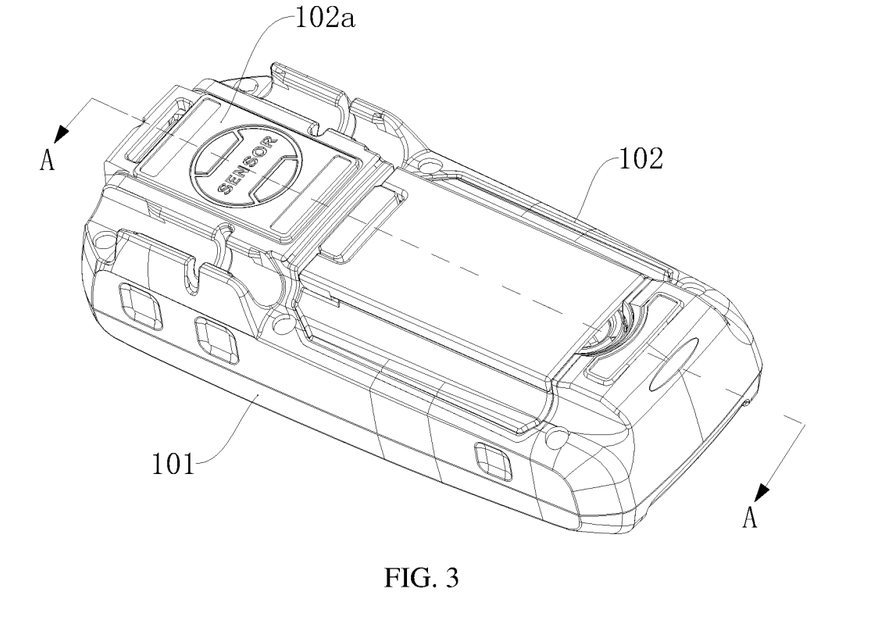
FIG. 3 is a back side view of a detection device provided in an embodiment of the present application.
Figure 4:
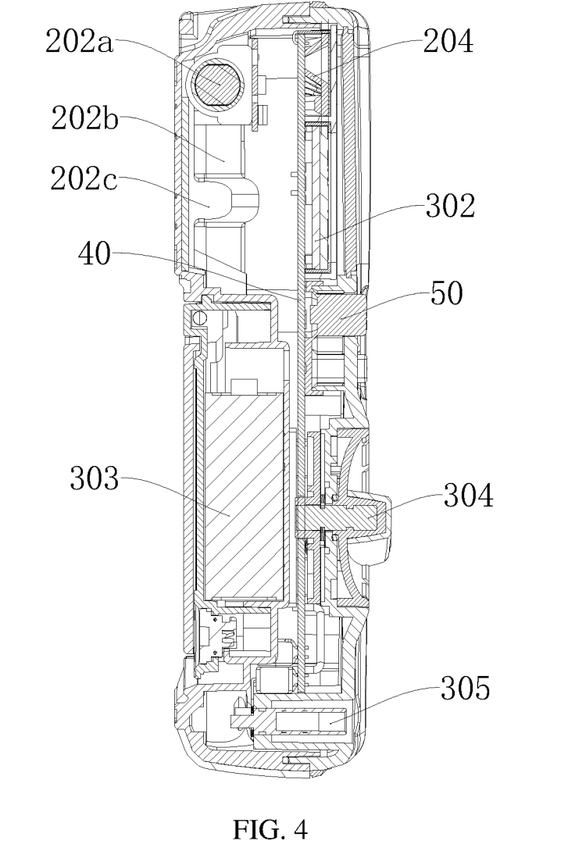
FIG. 4 is a sectional view in an A-A direction of FIG. 3.

A front surface of the top housing 101 is provided with the first display apparatus 204, the second display apparatus 302, the key assembly 50, the knob 304 dial and the input post hole group 305 in sequence in the second direction.

The key assembly 50 comprises a SEL key, a switch key and a RANGE/CAL key. The SEL key is a detection mode selection key, which is used for the selection among three detection modes: metal, foreign object, and alternating-current. The switch key provides a wall detection switching function. The RANGE/CAL key is a detection mode range setting and calibration key. The three keys are only used for the wall detection function. The key assembly 50 further comprises a MODE key, a RANGE key and a MAX/MIN key. The MODE key is for the selection of multimeter functions, the RANGE key is a range setting key, and the MAX/MIN key is a maximum and minimum value measurement key. The key assembly 50 further comprises a Hold key and an LCD backlight switch key.

The input post hole group 305 comprises three input post holes, including a 10A current range input terminal, a common input terminal and a positive input jack.

Figure 5:
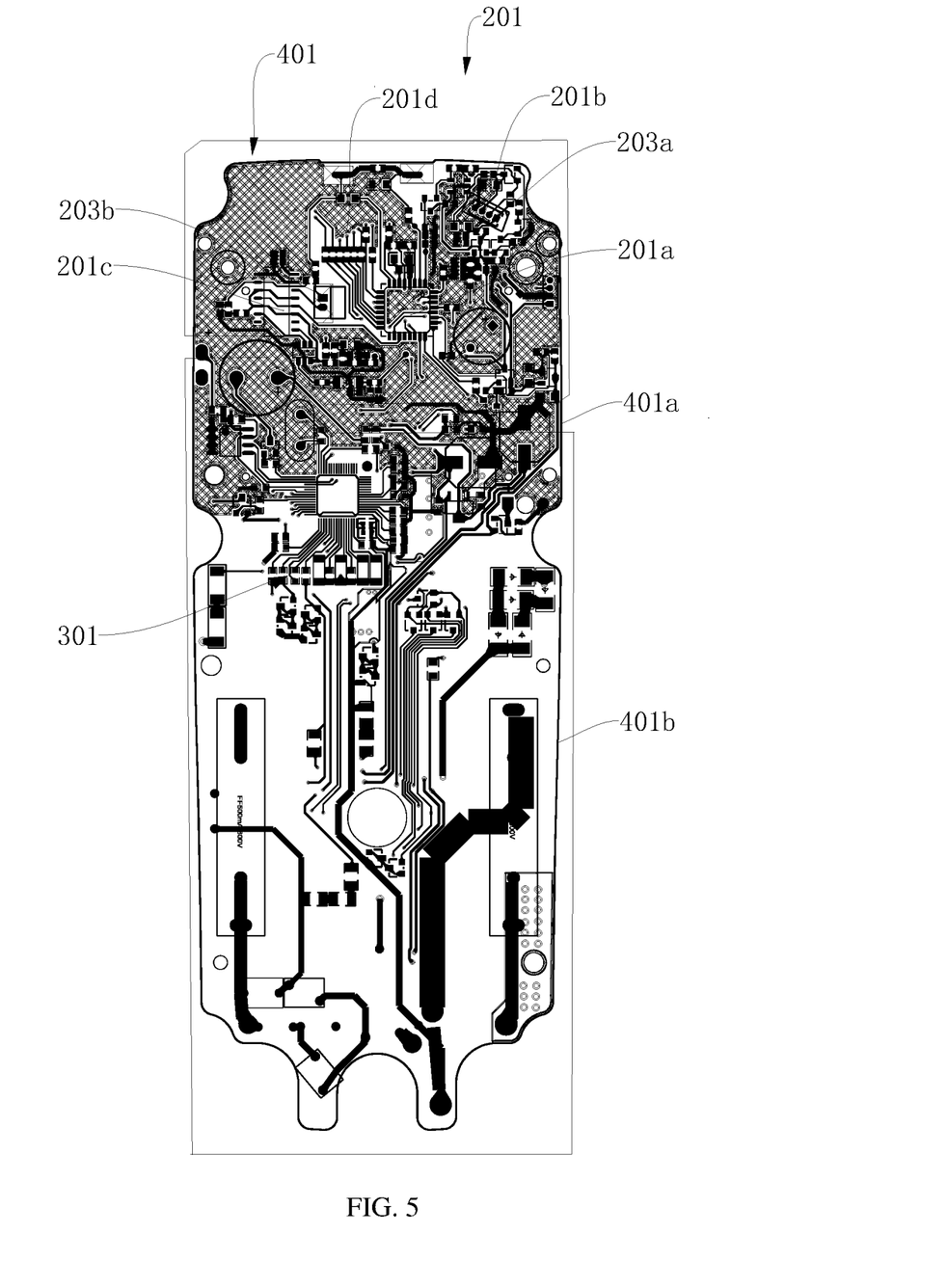
FIG. 5 is a schematic diagram of a first arrangement surface of a circuit arrangement layer provided in an embodiment of the present application.
Figure 6:
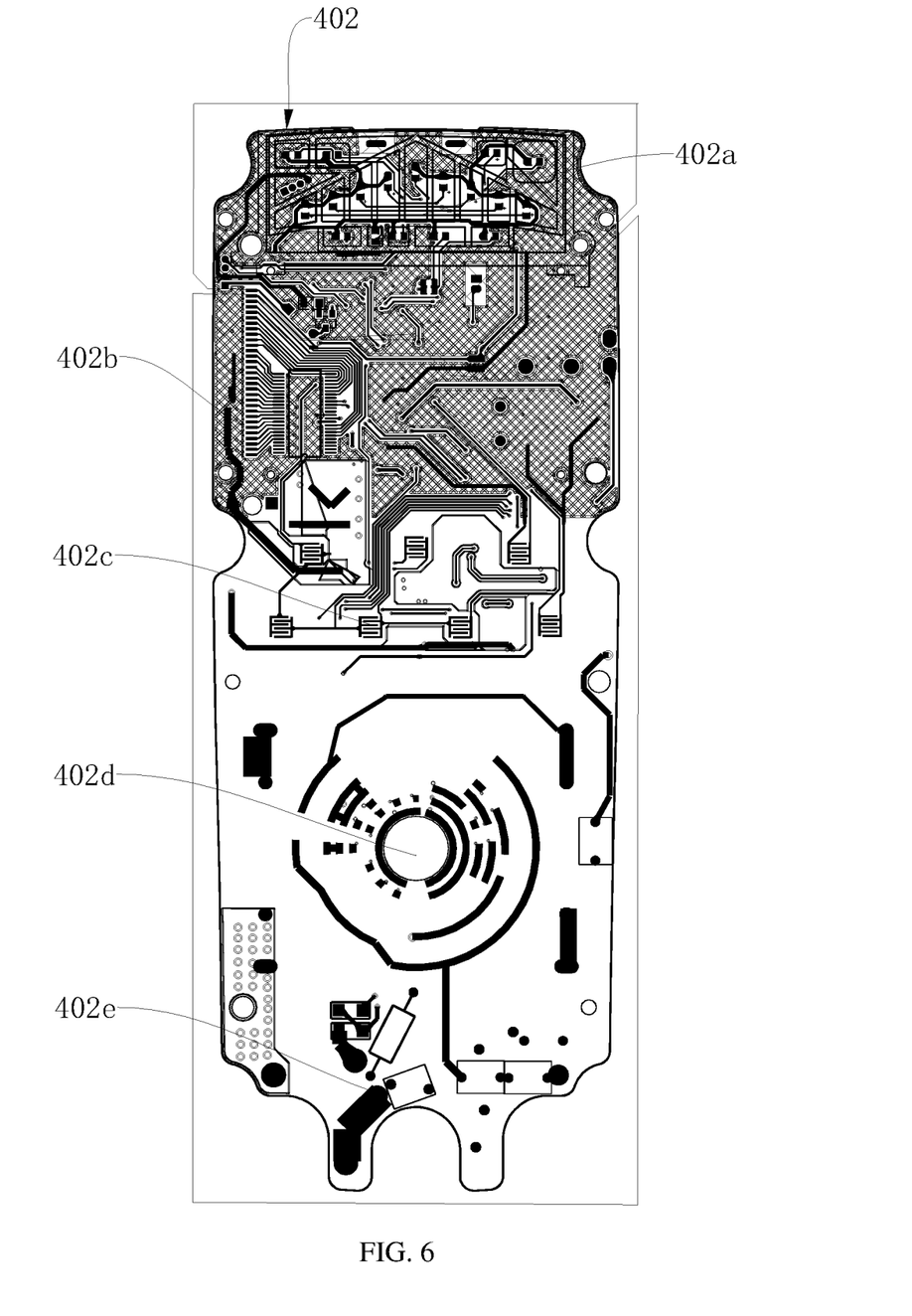
FIG. 6 is a schematic diagram of a second arrangement surface of the circuit arrangement layer provided in the embodiment of the present application.

More specifically, the circuit arrangement layer 40 has a first arrangement surface 401 and a second arrangement surface 402 facing away from each other. The first arrangement surface 401 is arranged facing the bottom housing 102, and the second arrangement surface 402 is arranged facing the top housing 101.

The first arrangement surface 401 has a first arrangement area 401a and a second arrangement area 401b which are partitioned in the second direction, the wall detection processing circuit 201 is arranged in the first arrangement area 401a, the multimeter measurement circuit 301 is arranged in the second arrangement area 401b, the sensing assembly 202 is arranged at the bottom housing 102, and the sensing assembly 202 is arranged opposite the first arrangement area 401a. In this way, the wall detection processing circuit 201 and the multimeter measurement circuit 301 are arranged on the same plane which is arranged close to the top housing 101, and the sensing assembly 202 may be mounted to the inner side wall of the bottom housing 102 via the connection structure 60.

In the second direction, the second arrangement surface 402 is sequentially provided with a first display control area 402a, a second display control area 402b, a key control area 402v, a knob control area 402d and a test lead contact control area 402e. The first display control area 402a is configured for connecting to and controlling the first display apparatus 204, the second display control area 402b is configured for connecting to and controlling the second display apparatus 302, the key control area 402c is configured for connecting to and controlling the key assembly 50, the knob control area 402d is configured for connecting to and controlling the knob 304, and the test lead contact control area 402e is configured for allowing a test lead to be inserted and transmitting an electric signal of the test lead.

In an embodiment, the circuit arrangement layer 40 is of a grid-like structure, and the circuit arrangement layer 40 is a copper hollow layer, so that the circuit structure adopts a grid-like copper hollow layer, which can further reduce the interference between signals to avoid a large impact on the detection signal of the metal detection sensing element 202a due to the use of solid copper cladding.

Referring to FIGS. 7 to 10, in an embodiment of the present application, the sensing assembly 202 comprises the metal detection sensing element 202a, and the metal detection sensing element 202a is detachably snapped to the inner side wall of the bottom housing 102 via the connection structure 60.

Figure 7:
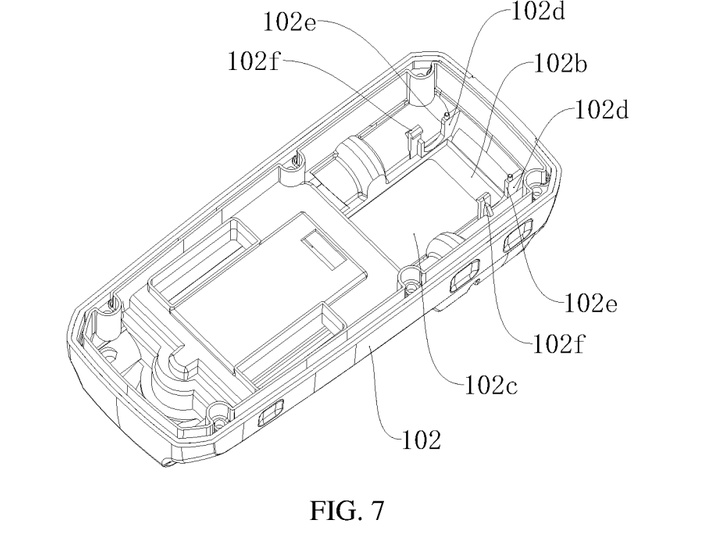
FIG. 7 is a schematic diagram of a bottom housing provided in an embodiment of the present application.
Figure 8:
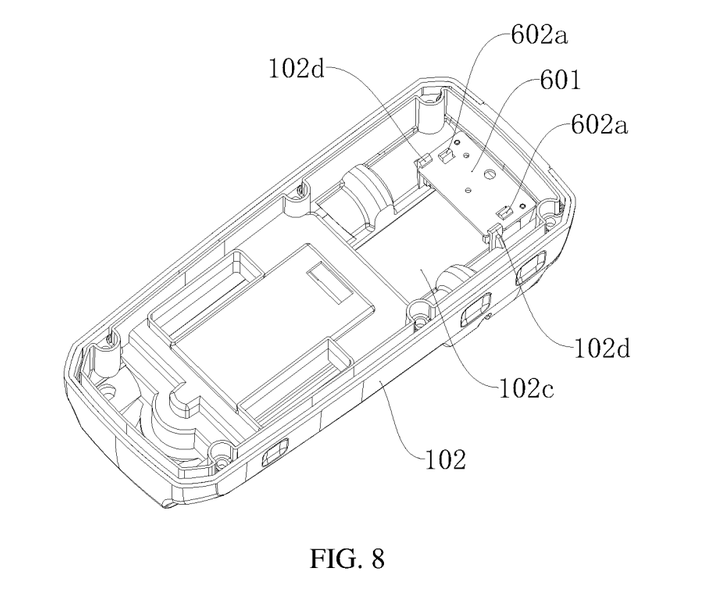
FIG. 8 is a schematic diagram of a metal detection sensing element provided in an embodiment of the present application, which is mounted in the bottom housing.

Of course, the metal detection sensing element 202a may also be detachably mounted to the inner side wall of the bottom housing 102 in other ways other than snapping. For example, the metal detection sensing element may be adhesively bonded to the inner side wall of the bottom housing 102. Alternatively, by using an elastic guide rail structure with a gradual opening, the metal detection sensing element 202a is inserted from a larger end of the opening and moved to a smaller end of the opening, and the metal detection sensing element 202a is positioned in the guide rail through the elasticity of the guide rail structure itself, so that the metal detection sensing element 202a is kept close to the inner side wall to ensure the reliability of detection.

In this embodiment, the sensing assembly 202 further comprises the foreign object detection sensing element 202b and the alternating-current signal sensing element. The foreign object detection sensing element 202b and the alternating-current signal sensing element are arranged in an integrated manner and form an integrated structure which is bonded to the inner side wall of the bottom housing 102 via the connection structure 60. The connection structure 60 is a bonding layer structure.

Of course, in other embodiments, the foreign object detection sensing element 202b and the alternating-current signal sensing element may be arranged separately, and the foreign object detection sensing element 202b and the alternating-current signal sensing element may be respectively bonded to the inner side wall of the bottom housing 102 via the bonding layer structure.

In other embodiments, the foreign object detection sensing element 202b and the alternating-current signal sensing element are arranged in an integrated manner and form an integrated structure which may be detachably snapped or inserted into the inner side wall of the bottom housing 102 via the connection structure 60. For example, the integrated structure may be detachably snapped to the inner side wall of the bottom housing 102 in a manner similar to that of the metal detection sensing element 202a.

In a specific embodiment, the inner side wall of the bottom housing 102 is provided with a receiving structure 102*d* adapted to the metal detection sensing element 202*a*. The receiving structure 102*d* has a receiving space for receiving the metal detection sensing element 202*a* and access openings 102*e* for allowing the metal detection sensing element 202*a* to access the receiving space. The metal detection sensing element 202*a* is snapped in the connection structure 60, the connection structure 60 is snapped on the access openings 102*e* of the receiving structure 102*d*, and the metal detection sensing element 202*a* is snap-pressed into the receiving space by the connection structure 60.

In this specific embodiment, the receiving structure 102*d* is provided on the inner side wall of the bottom housing 102, and the receiving structure 102*d* has a receiving space for receiving the metal detection sensing element 202*a*. The metal detection sensing element 202*a* is then received in the receiving space, and the metal detection sensing element 202*a* is infinitely close to the inner side wall of the bottom housing 102, so that the mounting and detection of the metal detection sensing element 202*a* can be realized reliably and conveniently.

More specifically, the connection structure 60 comprises a connection board 601 and a pair of snap rings 602, the pair of snap rings 602 are arranged opposite and spaced apart from each other, the pair of snap rings 602 are detachably snapped to the connection board 601, and two axial ends of the metal detection sensing element 202*a* are respectively snapped in the pair of snap rings 602. At least one pair of snap fittings 102*f* are provided on an outer side of the access openings 102*e*, the pair of snap fittings 102*f* are arranged opposite and spaced apart from each other, and two opposite ends of the connection board 601 are respectively detachably snapped to the pair of snap fittings 102*f*.

Figure 9:
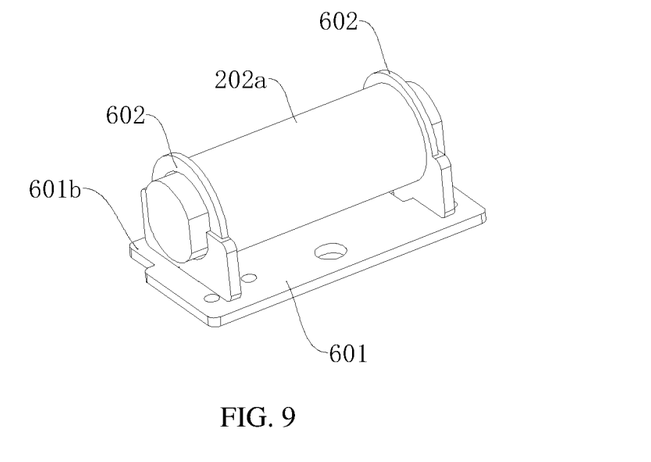
FIG. 9 is a schematic diagram of the assembly of a metal detection sensing element and a connection structure provided in an embodiment of the present application.
Figure 10:
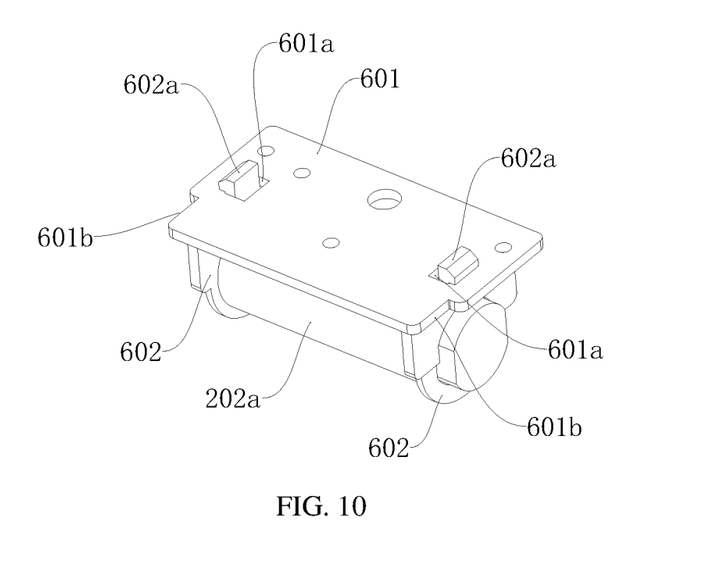
FIG. 10 is a schematic diagram of the assembly of a metal detection sensing element and a connection structure provided in an embodiment of the present application.

During specific mounting, the two axial ends of the metal detection sensing element 202*a* are respectively snapped in the pair of snap rings 602, and then the pair of snap rings 602 are snapped to the connection board 601, so that the metal detection sensing element 202*a*, the pair of snap rings 602 and the connection board 601 form a mounting module. The side where the metal detection sensing element 202*a* is located faces and approaches the access opening 102*e* of the receiving space, the metal detection sensing element 202*a* is pushed into the receiving space from the access opening 102*e*, and when the metal detection sensing element 202*a* is pushed into place, the connection board 601 is just snapped to the pair of snap fittings 102*f*, so that the mounting module is integrally and detachably snapped on the receiving structure 102*d*.

In an embodiment, a board surface of the connection board 601 is provided with a pair of snap openings 601*a* through its thickness, the pair of snap openings 601*a* are arranged spaced apart from each other, the pair of snap rings 602 each have a snap head 602*a* connected to a ring body thereof, and the two snap heads 602*a* are respectively detachably snapped into the pair of snap openings 601*a*, such that the metal detection sensing element 202*a* is fixed relative to the connection board 601.

In a specific embodiment, the receiving structure 102*d* comprises a pair of U-shaped structures arranged opposite and spaced apart from each other, openings of the pair of U-shaped structures are the access openings 102*e*, and edges of the pair of U-shaped structures on the same side are provided with the pair of snap fittings 102*f*. A pair of snap steps 601*b* are provided at the two opposite ends of the connection board 601, and the pair of snap steps 601*b* are recessed from side edges of the connection board 601 toward its inner side to form a stepped shape, and the pair of snap fittings 102*f* are fastened to the pair of snap steps 601*b*, such that the metal detection sensing element 202*a* is fixed relative to the bottom housing 102.

In this specific embodiment, the receiving structure 102*d* comprises the pair of U-shaped structures that are arranged opposite and spaced apart from each other, and there is an access space between the pair of U-shaped structures, so that an operator can easily mount or dismount the mounting module through the access space.

In this specific embodiment, the pair of snap fittings 102*f* are provided at the edges of the pair of U-shaped structures on the same side. During specific implementation, those skilled in the art can actually design the number of pairs of snap fittings 102*f* according to the actual volume size of the mounting module and the size of the mounting space.

In a more specific embodiment, the snap ring 602 comprises a first half split ring and a second half split ring, and the first half split ring and the second half split ring are detachably snap-fitted with each other such that the axial end of the metal detection sensing element 202*a* is snapped into the snap ring 602, and one of the first half split ring and the second half split ring is provided with the snap head 602*a*.

Alternatively, the snap ring 602 is of a complete ring structure, and the two axial ends of the metal detection sensing element 202*a* are each provided with a step structure, such that the metal detection sensing element 202*a* is snapped into the pair of snap rings 602 by means of the step structures at the two axial ends.

Compared with the prior art, in the embodiment of the present application, the metal detection sensing element 202*a* may be detachably snapped to the inner side wall of the bottom housing 102 by means of the connection board 601, the snap rings 602, the snap fittings 102*f*, etc., so as to avoid the use of metallic fasteners for the mounting of the metal detection sensing element 202*a* adversely affecting the acquisition and transmission of a sensing detection signal, so as to improve the sensitivity and stability of the detection signal.

Further, the inner side wall of the bottom housing 102 is provided with an adapted receiving structure 102*d*, and the mounting module composed of the metal detection sensing element 202*a*, the pair of snap rings 602 and the connection board 601 may be integrally mounted in the receiving structure 102*d*, or dismounted from the receiving structure 102*d*, increasing the convenience of mounting and dismounting of the metal detection sensing element 202*a* while improving the sensitivity and stability of the detection signal.

In a further embodiment, another mounting method for the metal detection sensing element is provided. In this embodiment, the sensing assembly 202 comprises the metal detection sensing element 202*a*, and the metal detection sensing element 202*a* is bonded to the inner side wall of the bottom housing 102 via the connection structure 60.

Specifically, the inner side wall of the bottom housing 102 is provided with a receiving structure 102*d* adapted to the metal detection sensing element 202*a*. The receiving structure 102*d* has a receiving space for receiving the metal detection sensing element 202*a* and access openings 102*e* for allowing the metal detection sensing element 202*a* to access the receiving space.

The metal detection sensing element 202*a* is snapped in the connection structure 60, the connection structure 60 is bonded to the access openings 102*e* of the receiving structure 102*d*, and the metal detection sensing element 202*a* is snap-pressed into the receiving space by the connection structure 60.

More specifically, the connection structure 60 comprises a connection board 601 and a pair of bonding rings, the pair of bonding rings are arranged opposite and spaced apart from each other, ring bodies of the pair of bonding rings are bonded to the connection board 601, two axial ends of the metal detection sensing element 202a are respectively snapped in the pair of bonding rings, and two opposite ends of the connection board 601 are bonded to edges of the access openings.

In the further embodiment, the snap fitting 102f and the snap head 602a are omitted, and the positions where the snap fitting 102f and the snap head 602a are located are designed to adhesive surfaces, and an adhesive is used at the two positions to bond the bonding ring to the connection board and the connection board to the receiving structure, so that the metal detection sensing element is adhesively bonded to the inner side wall of the bottom housing via the connection structure.

In the above two embodiments, the snap ring or the bonding ring may be made of plastic.

In the above two embodiments, preferably, the connection board is a circuit board, the metal detection sensing element is a metal detection sensor, and the circuit board is electrically connected to the metal detection sensing element and the wall detection processing circuit.

Alternatively, the metal detection sensing element may comprise a metal detection sensor and an intermediate circuit board, two axial ends of the metal detection sensor are detachably snapped into the pair of snap rings, the intermediate circuit board may be arranged on a side surface of the connection board that is close to the metal detection sensor, and the metal detection sensor may be electrically connected to the wall detection processing circuit via an intermediate circuit.

In this embodiment, the foreign object detection sensing element 202b and the alternating-current voltage signal sensing element 202c are arranged in an integrated manner, and the integrated structure of the two comprises a foreign object detection sensor, an alternating-current voltage signal sensor and an intermediate circuit board, the foreign object detection sensor and the alternating-current voltage signal sensor are respectively integrated on the intermediate circuit board, and the integrated structure is fixed to a bottom wall of the bottom housing 102 by snapping or bonding, so as to avoid the use of metallic fasteners for the mounting of the metal detection sensing element 202a adversely affecting the acquisition and transmission of a sensing detection signal, so as to improve the sensitivity and stability of the detection signal.

In a most preferred embodiment, the sensing assembly 202 comprises the metal detection sensing element 202a, the foreign object detection sensing element 202b and the alternating-current signal sensing element, and the connection structure 60 comprises a first connection structure 60 and a second connection structure 60.

The metal detection sensing element 202a is detachably snapped to the inner side wall of the bottom housing 102 via the first connection structure. The foreign object detection sensing element 202b and the alternating-current signal sensing element are arranged in an integrated manner and form an integrated structure which is bonded to the inner side wall of the bottom housing 102 via the second connection structure; The second connection structure is a bonding layer.

The bottom housing 102 is provided with a receiving groove for receiving the sensing assembly 202, and flat surfaces 102a are provided on inner and outer sides of a groove bottom surface of the receiving groove. The flat surface 102a on the inner side of the groove bottom surface comprises a first flat area 102b and a second flat area 102c, the metal detection sensing element 202a is opposite and spaced from the first flat area 102b, the integrated structure is bonded to the second flat area 102c, and the second flat area 102c avoids a spaced space between the metal detection sensing element 202a and the first flat area 102b.

In the most preferred embodiment, the second flat area 102c avoids the spaced space between the metal detection sensing element 202a and the first flat area 102b, so that it is possible to ensure that the detection of the foreign object detection sensing element 202b and the detection of the alternating-current signal sensing element as well as the detection of the metal detection sensing elements 202a do not interfere with one another, so as to improve the accuracy and stability of detection.

In an embodiment, the top housing 101 and the bottom housing 102 are snap-fitted with each other and form a snap contour, and snap-fit positions of the top housing 101 and the bottom housing 102 are connected via a metallic fastener. In a direction from an inner side to an outer side of the housing 10, the inner side wall where the snap contour is located is spaced from a groove wall of the receiving groove, and the sensing assembly 202 is arranged on an inner side of the groove wall of the receiving groove, such that the sensing assembly 202 is spaced apart from the metallic fastener, so as to reduce the influence of metallic fasteners on the metal detection sensing element 202a.

Referring to FIGS. 1 to 6, in a preferred embodiment of the present application, the sensing assembly 202 comprises the metal detection sensing element 202a, the foreign object detection sensing element 202b and the alternating-current voltage signal sensing element 202c, and the wall detection processing circuit 201 comprises a wall detection control unit 201a, and a metal detection processing circuit 201b, a foreign object detection processing circuit 201c and an alternating-current voltage signal processing circuit 201d which are respectively electrically connected to the wall detection control unit 201a.

The metal detection sensing element 202a is electrically connected to the metal detection processing circuit 201b, and the metal detection sensing element 202a is configured to acquire metal parameters to be detected of a wall to be detected and transmit same to the metal detection processing circuit 201b. The detection purpose of the metal detection sensing element 202a is to detect whether there is a metallic structure or substance in a region to be detected of the wall to be detected.

The foreign object detection sensing element 202b is electrically connected to the foreign object detection processing circuit 201c, and the foreign object detection sensing element 202b is configured to acquire foreign object parameters to be detected of the wall to be detected and transmit same to the foreign object detection processing circuit 201c. The detection purpose of the foreign object detection sensing element 202b is to detect whether there are foreign objects in the region to be detected of the wall to be detected, including but not limited to whether there are wooden battens, metal pipes, wire pipes or other substances.

The alternating-current voltage signal sensing element 202c is electrically connected to the alternating-current voltage signal processing circuit 201d, and the alternating-current voltage signal sensing element 202c is configured to acquire alternating-current voltage signals to be detected of the wall to be detected and transmit same to the alternating-current voltage signal processing circuit 201d. The detection purpose of the alternating-current voltage detection sensing element is to detect whether there is a circuit structure in the region to be detected of the wall to be detected.

The wall detection processing circuit 201 is electrically connected to the first display apparatus 204. Specifically, the wall detection control unit 201*a* of the wall detection processing circuit 201 is electrically connected to the first display apparatus 204. The first display apparatus 204 is configured to display characterizable parameters obtained by processing the parameters to be detected by the wall detection processing circuit 201, for example, it may display metal, foreign object and alternating-current detection mode symbols, a range, a low power symbol and an analog tone display of detection signal strength.

The multimeter measurement circuit 301 is electrically connected to the second display apparatus 302. The second display apparatus 302 is configured to display characterizable signals obtained by processing the detection signals by the multimeter measurement circuit 301, for example, it may be configured to display alternating-current and direct-current voltage, current, resistance, capacitance, temperature and other data.

What are described above are only preferred embodiments of the present application but not intended to limit the present application, and any modifications, equivalent replacements, improvements, etc. made within the spirit and principle of the present application should be included within the scope of protection of the present application.

The invention claimed is:

1. A detection device, comprising:
a housing (10), a wall detection assembly (20) and a multimeter assembly (30), wherein
the wall detection assembly (20) comprises a sensing assembly (202) and a wall detection processing circuit (201), the sensing assembly (202) and the wall detection processing circuit (201) being both arranged inside the housing (10); and the sensing assembly (202) being electrically connected to the wall detection processing circuit (201), and the sensing assembly (202) comprising at least one of a metal detection sensing element (202*a*), a foreign object detection sensing element (202*b*) and an alternating-current voltage signal sensing element (202*c*);
wherein the sensing assembly (202) and the wall detection processing circuit (201) are arranged spaced apart in a first direction, and the sensing assembly (202) and the multimeter assembly (30) are arranged staggered in a second direction, the first direction and the second direction forming an included angle; and the sensing assembly (202) is mounted to an inner side wall of the housing (10) via a connection structure (60), wherein
the housing (10) comprises a top housing (101) and a bottom housing (102) that are snap-fitted with respect to each other in the first direction, and the multimeter assembly (30) further comprises a multimeter measurement circuit (301) arranged inside the housing (10); and
the wall detection processing circuit (201) and the multimeter measurement circuit (301) are arranged on the same plane which is arranged closer to the top housing (101) than to the bottom housing (102), and the sensing assembly (202) is mounted to an inner side wall of the bottom housing (102) via the connection structure (60), wherein
the sensing assembly (202) comprises the metal detection sensing element (202*a*), and the metal detection sensing element (202*a*) is detachably snapped to the inner side wall of the bottom housing (102) via the connection structure (60).

2. The detection device of claim 1, wherein
the inner side wall of the bottom housing (102) is provided with a receiving structure (102*d*) adapted to the metal detection sensing element (202*a*), the receiving structure (102*d*) having a receiving space for receiving the metal detection sensing element (202*a*) and access openings (102*e*) for allowing the metal detection sensing element (202*a*) to access the receiving space; and
the metal detection sensing element (202*a*) is snapped in the connection structure (60), the connection structure (60) is snapped on the access openings (102*e*) of the receiving structure (102*d*), and the metal detection sensing element (202*a*) is snap-pressed into the receiving space by the connection structure (60).

3. The detection device of claim 2, wherein
the connection structure (60) comprises a connection board (601) and a pair of snap rings (602), the pair of snap rings (602) are arranged opposite and spaced apart from each other, the pair of snap rings (602) are detachably snapped to the connection board (601), and two axial ends of the metal detection sensing element (202*a*) are respectively snapped in the pair of snap rings (602); and
at least one pair of snap fittings (102*f*) are provided on an outer side of the access openings (102*e*), the pair of snap fittings (102*f*) are arranged opposite and spaced apart from each other, and two opposite ends of the connection board (601) are respectively detachably snapped to the pair of snap fittings (102*f*).

4. The detection device of claim 3, wherein
a board surface of the connection board (601) is provided with a pair of snap openings (601*a*) through its thickness, the pair of snap openings (601*a*) are arranged spaced apart from each other, the pair of snap rings (602) each have a snap head (602*a*) connected to a ring body thereof, and the two snap heads (602*a*) are respectively detachably snapped into the pair of snap openings (601*a*), such that the metal detection sensing element (202*a*) is fixed relative to the connection board (601).

5. The detection device of claim 3, wherein
the receiving structure (102*d*) comprises a pair of U-shaped structures arranged opposite and spaced apart from each other, openings of the pair of U-shaped structures are the access openings (102*e*), and edges of the pair of U-shaped structures on the same side are provided with the pair of snap fittings (102*f*); and
a pair of snap steps (601*b*) are provided at the two opposite ends of the connection board (601), and the pair of snap steps (601*b*) are recessed from side edges of the connection board (601) toward its inner side to form a stepped shape, and the pair of snap fittings (102*f*) are fastened to the pair of snap steps (601*b*), such that the metal detection sensing element (202*a*) is fixed relative to the bottom housing (102).

6. The detection device of claim 3, wherein
the connection board is a circuit board electrically connected to the metal detection sensing element (202*a*) and the wall detection processing circuit (201).

7. The detection device of claim 3, wherein
the sensing assembly (202) comprises the foreign object detection sensing element (202*b*) and the alternating-current voltage signal sensing element (202*c*), the foreign object detection sensing element (202*b*) and the alternating-current voltage signal sensing element (202c) being arranged in an integrated manner and forming an integrated structure which is bonded to the inner side wall of the bottom housing (102) via the connection structure (60);

wherein the connection structure (60) is a bonding layer structure.

8. The detection device of claim 2, wherein
the sensing assembly (202) comprises the foreign object detection sensing element (202b) and the alternating-current voltage signal sensing element (202c), the foreign object detection sensing element (202b) and the alternating-current voltage signal sensing element (202c) being arranged in an integrated manner and forming an integrated structure which is bonded to the inner side wall of the bottom housing (102) via the connection structure (60);

wherein the connection structure (60) is a bonding layer structure.

9. The detection device of claim 2, wherein
the sensing assembly (202) comprises the metal detection sensing element (202a), the foreign object detection sensing element (202b) and the alternating-current voltage signal sensing element (202c), and the connection structure (60) comprises a first connection structure and a second connection structure;

wherein the metal detection sensing element (202a) is detachably snapped to the inner side wall of the bottom housing (102) via the first connection structure; the foreign object detection sensing element (202b) and the alternating-current voltage signal sensing element (202c) are arranged in an integrated manner and form an integrated structure which is bonded to the inner side wall of the bottom housing (102) via the second connection structure; wherein the second connection structure (60) is a bonding layer;

the bottom housing (102) is provided with a receiving groove for receiving the sensing assembly (202), and flat surfaces (102a) are provided on inner and outer sides of a groove bottom surface of the receiving groove; wherein the flat surface on the inner side of the groove bottom surface comprises a first flat area (102b) and a second flat area (102c), the metal detection sensing element (202a) is opposite and spaced from the first flat area (102b), the integrated structure is bonded to the second flat area (102c), and the second flat area (102c) avoids a spaced space between the metal detection sensing element (202a) and the first flat area (102b).

10. The detection device of claim 1, wherein the sensing assembly (202) comprises the metal detection sensing element (202a), and the metal detection sensing element (202a) is bonded to the inner side wall of the bottom housing (102) via the connection structure (60).

11. The detection device of claim 10, wherein
the inner side wall of the bottom housing (102) is provided with a receiving structure (102d) adapted to the metal detection sensing element (202a), the receiving structure (102d) having a receiving space for receiving the metal detection sensing element (202a) and access openings (102e) for allowing the metal detection sensing element (202a) to access the receiving space; and
the metal detection sensing element (202a) is snapped in the connection structure (60), the connection structure (60) is bonded to the access openings (102e) of the receiving structure (102d), and the metal detection sensing element (202a) is snap-pressed into the receiving space by the connection structure (60).

12. The detection device of claim 11, wherein
the connection structure (60) comprises a connection board (601) and a pair of bonding rings, the pair of bonding rings are arranged opposite and spaced apart from each other, ring bodies of the pair of bonding rings are bonded to the connection board (601), two axial ends of the metal detection sensing element (202a) are respectively snapped in the pair of bonding rings, and two opposite ends of the connection board (601) are bonded to edges of the access openings (102e).

13. The detection device of claim 11, wherein the connection board is a circuit board electrically connected to the metal detection sensing element and the wall detection processing circuit.

14. The detection device of claim 1, wherein
the sensing assembly (202) comprises the foreign object detection sensing element (202b) and the alternating-current voltage signal sensing element (202c), the foreign object detection sensing element (202b) and the alternating-current voltage signal sensing element (202c) being arranged in an integrated manner and forming an integrated structure which is bonded to the inner side wall of the bottom housing (102) via the connection structure (60);

wherein the connection structure (60) is a bonding layer structure.

15. The detection device of claim 1, wherein
the sensing assembly (202) comprises the metal detection sensing element (202a), the foreign object detection sensing element (202b) and the alternating-current voltage signal sensing element (202c), and the connection structure (60) comprises a first connection structure and a second connection structure;

wherein the metal detection sensing element (202a) is detachably snapped to the inner side wall of the bottom housing (102) via the first connection structure; the foreign object detection sensing element (202b) and the alternating-current voltage signal sensing element (202c) are arranged in an integrated manner and form an integrated structure which is bonded to the inner side wall of the bottom housing (102) via the second connection structure; wherein the second connection structure (60) is a bonding layer;

the bottom housing (102) is provided with a receiving groove for receiving the sensing assembly (202), and flat surfaces (102a) are provided on inner and outer sides of a groove bottom surface of the receiving groove; wherein the flat surface on the inner side of the groove bottom surface comprises a first flat area (102b) and a second flat area (102c), the metal detection sensing element (202a) is opposite and spaced from the first flat area (102b), the integrated structure is bonded to the second flat area (102c), and the second flat area (102c) avoids a space spaced between the metal detection sensing element (202a) and the first flat area (102b).

16. The detection device of claim 15, wherein
the top housing (101) and the bottom housing (102) are snap-fitted with each other and form a snap contour, and snap-fit positions of the top housing (101) and the bottom housing (102) are connected via a metallic fastener; and
in a direction from an inner side to an outer side of the housing (10), the inner side wall where the snap contour is located is spaced from a groove wall of the receiving groove, and the sensing assembly (202) is arranged on an inner side of the groove wall of the receiving groove, such that the sensing assembly (202) is spaced apart from the metallic fastener.

17. The detection device of claim 1, wherein
the sensing assembly (202) comprises the foreign object detection sensing element (202*b*) and the alternating-current voltage signal sensing element (202*c*), the foreign object detection sensing element (202*b*) and the alternating-current voltage signal sensing element (202*c*) being arranged in an integrated manner and forming an integrated structure which is bonded to the inner side wall of the bottom housing (102) via the connection structure (60);
wherein the connection structure (60) is a bonding layer structure.

18. The detection device of claim 1, wherein
the sensing assembly (202) comprises the metal detection sensing element (202*a*), the foreign object detection sensing element (202*b*) and the alternating-current voltage signal sensing element (202*c*), and the connection structure (60) comprises a first connection structure and a second connection structure;
wherein the metal detection sensing element (202*a*) is detachably snapped to the inner side wall of the bottom housing (102) via the first connection structure; the foreign object detection sensing element (202*b*) and the alternating-current voltage signal sensing element (202*c*) are arranged in an integrated manner and form an integrated structure which is bonded to the inner side wall of the bottom housing (102) via the second connection structure; wherein the second connection structure (60) is a bonding layer;
the bottom housing (102) is provided with a receiving groove for receiving the sensing assembly (202), and flat surfaces (102*a*) are provided on inner and outer sides of a groove bottom surface of the receiving groove; wherein the flat surface on the inner side of the groove bottom surface comprises a first flat area (102*b*) and a second flat area (102*c*), the metal detection sensing element (202*a*) is opposite and spaced from the first flat area (102*b*), the integrated structure is bonded to the second flat area (102*c*), and the second flat area (102*c*) avoids a spaced space between the metal detection sensing element (202*a*) and the first flat area (102*b*).

* * * * *